United States Patent
Nakata et al.

(10) Patent No.: US 8,629,479 B2
(45) Date of Patent: Jan. 14, 2014

(54) SEMICONDUCTOR DEVICE

(75) Inventors: Ken Nakata, Kanagawa (JP); Isao Makabe, Kanagawa (JP); Keiichi Yui, Kanagawa (JP)

(73) Assignee: Sumitomo Electric Industries, Ltd., Osaka (JP)

( * ) Notice: Subject to any disclaimer, the term of this patent is extended or adjusted under 35 U.S.C. 154(b) by 8 days.

(21) Appl. No.: 13/192,766

(22) Filed: Jul. 28, 2011

(65) Prior Publication Data

US 2012/0025206 A1 Feb. 2, 2012

(30) Foreign Application Priority Data

Jul. 29, 2010 (JP) ................................. 2010-171055

(51) Int. Cl.
*H01L 29/778* (2006.01)

(52) U.S. Cl.
USPC ..... 257/192; 257/190; 257/194; 257/E29.246

(58) Field of Classification Search
CPC .................................................... H01L 29/778
USPC .......... 257/190, 194, 192, E29.246, E29.249, 257/E29.253
See application file for complete search history.

(56) References Cited

U.S. PATENT DOCUMENTS

| 2008/0197359 | A1* | 8/2008 | Imanishi et al. ................. 257/76 |
| 2008/0210949 | A1 | 9/2008 | Makabe et al. |
| 2009/0250767 | A1* | 10/2009 | Nomura et al. ............... 257/392 |
| 2010/0109018 | A1* | 5/2010 | Chen et al. ....................... 257/76 |
| 2011/0062556 | A1* | 3/2011 | Komiyama et al. ........... 257/615 |
| 2011/0215424 | A1* | 9/2011 | Sato ............................... 257/409 |
| 2011/0241088 | A1* | 10/2011 | Sato et al. ..................... 257/288 |

FOREIGN PATENT DOCUMENTS

JP 2008-166349 A 7/2008

OTHER PUBLICATIONS

Eberlein et al., "Shallow acceptors in GaN", Appl. Phys. Lett. 91, 132105 (2007).*

* cited by examiner

*Primary Examiner* — Yu Chen
(74) *Attorney, Agent, or Firm* — Westerman, Hattori, Daniels & Adrian, LLP

(57) ABSTRACT

A semiconductor device includes a first GaN layer provided on a SiC substrate, a second GaN layer provided on the first GaN layer, and an electron supply layer that is provided on the second GaN layer and has a band gap greater than that of GaN, the first GaN layer having an acceptor concentration higher than that of the second GaN layer.

17 Claims, 5 Drawing Sheets

SEMICONDUCTOR DEVICE

CROSS-REFERENCE TO RELATED APPLICATION

This application is based upon and claims the benefit of priority of the prior Japanese Patent Application No. 2010-171055 filed on Jul. 29, 2010, the entire contents of which are incorporated herein by reference.

BACKGROUND (i) Technical Field

A certain aspect of the embodiments discussed herein is related to a semiconductor device. Another aspect of the embodiments is related to a semiconductor device having a SiC substrate.

(ii) Related Art

A semiconductor devices using a nitride semiconductor is used as a power device operating at high frequencies and outputting high power. Particularly, there is known an FET such as a high electron mobility transistor (HEMT) as a semiconductor device suitable for amplification in a high-frequency or RF (radio frequency) band such as a microwave band, a quasi-millimeter band or a millimeter band.

As a semiconductor device having a nitride semiconductor, there is known a semiconductor device in which an AlN layer, an AlGaN layer, a GaN layer and an electron supply layer are sequentially stacked in this order on a Si substrate (see Japanese Patent application Publication No. 2008-166349). Besides the Si substrate, there is known a SiC substrate having a lattice constant relatively close to that of GaN as a substrate for the semiconductor device including a nitride semiconductor.

The semiconductor device using a nitride semiconductor is desired to operate at higher frequencies. To achieve higher operating frequencies, it is desired to improve the pinch-off characteristic by a short gate.

SUMMARY

According to an aspect of the present invention, there is provided a semiconductor device including: a first GaN layer provided on a SiC substrate; a second GaN layer provided on the first GaN layer; and an electron supply layer that is provided on the second GaN layer and has a band gap greater than that of GaN, the first GaN layer having an acceptor concentration higher than that of the second GaN layer.

DETAILED DESCRIPTION

Figure 1:
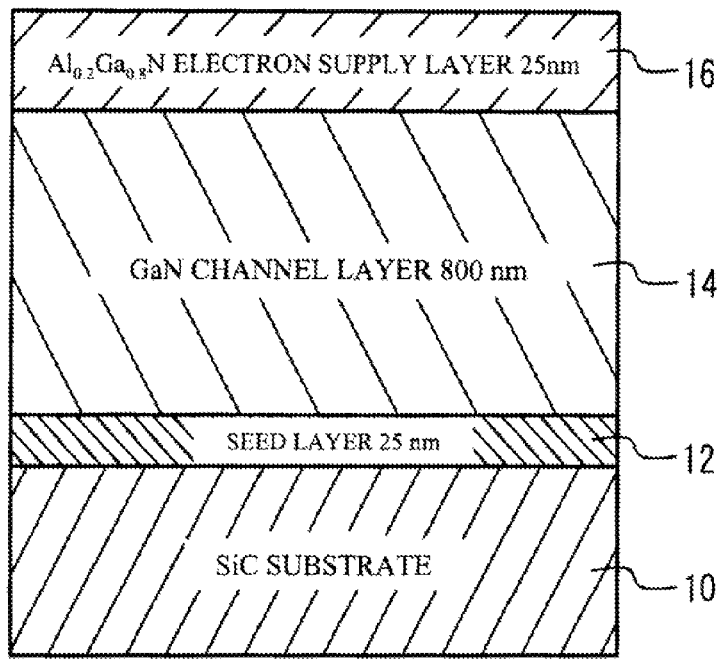
FIG. 1 is a schematic cross-sectional view of an epitaxial layer of a semiconductor device in accordance with a first comparative example.

First, a semiconductor device in accordance with a first and comparative example is described. FIG. 1 is a schematic cross-sectional view of an epitaxial layer of a semiconductor device in accordance with the first comparative example. As illustrated in FIG. 1, a seed layer 12 made of aluminum nitride (AlN) is grown on a SiC substrate 10 by metal organic chemical vapor deposition (MOCVD), for example. The growth condition is as follows.

Source gas: TMA (trimethylaluminium), $NH_3$ (ammonia)
Growth temperature: 1100° C.
Pressure: 13.3 kPa
Thickness: 25 nm A GaN channel layer 14 is grown on the seed layer 12 under the following condition.

Source gas: TMG (trimethylgallium), $NH_3$
Growth temperature: 1050° C.
Pressure: 13.3 kPa
V/III ratio: 5000
Growth rate: 0.2 nm/sec
Thickness: 800 nm An AlGaN electron supply layer 16 is grown on the GaN channel layer 14 under the following condition.

Source gas: TMA, TMG, $NH_3$
Al composition ratio: 20%
Thickness: 25 nm

In the first comparative example, the GaN channel layer 14 is formed on the SiC substrate 10 so as to interpose the seed layer 12 therebetween. Thus, there is a lattice mismatch between SiC and GaN although SiC and GaN have relatively close lattice constants. The lattice mismatch may cause dislocation in the GaN channel layer 14. The dislocation is a factor of traps. In the growth by MOCVD, C (carbon) included in the source is taken in the GaN channel layer 14, and the C concentration may be raised. In a photoluminescence evaluation of GaN crystal having a high C concentration, broad emission is observed in a wavelength band of 500 nm~700 nm (yellow band). Emission in the yellow band suggests the presence of deep traps. The traps may be a factor of transient response of the current-voltage characteristic, which is typically current collapse.

In order to reduce the traps, it is conceivable to reduce the dislocation density in the GaN channel layer 14 and reduce the emission strength in the yellow band. The dislocation density may be reduced by making the GaN channel layer 14 thicker. For example, as the thickness of the GaN channel layer 14 is increased to 500 nm, 1000 nm and 1600 nm, the dislocation density is reduced to $1.0\times10^{10}$ $cm^{-2}$, $1.0\times10^9$ $cm^{-2}$ and $5.0\times10^8$ $cm^{-2}$, respectively. In order to reduce the emission strength in the yellow band, it is conceivable to reduce the amount of C taken in the step of growing the GaN channel layer 14 and make the C concentration lower. The C concentration may be reduced by controlling the condition for growing the GaN channel layer 14. For example, the V/III ratio may be raised, the growth temperature may be raised or the growth rate may be lowered. For example, as the growth temperature is raised to 1000° C., 1050° C. and 1100° C., the value obtained by dividing the emission intensity in the yellow band by the band-edge strength decreases to 10, 1 and 0.1, respectively.

Figure 2:
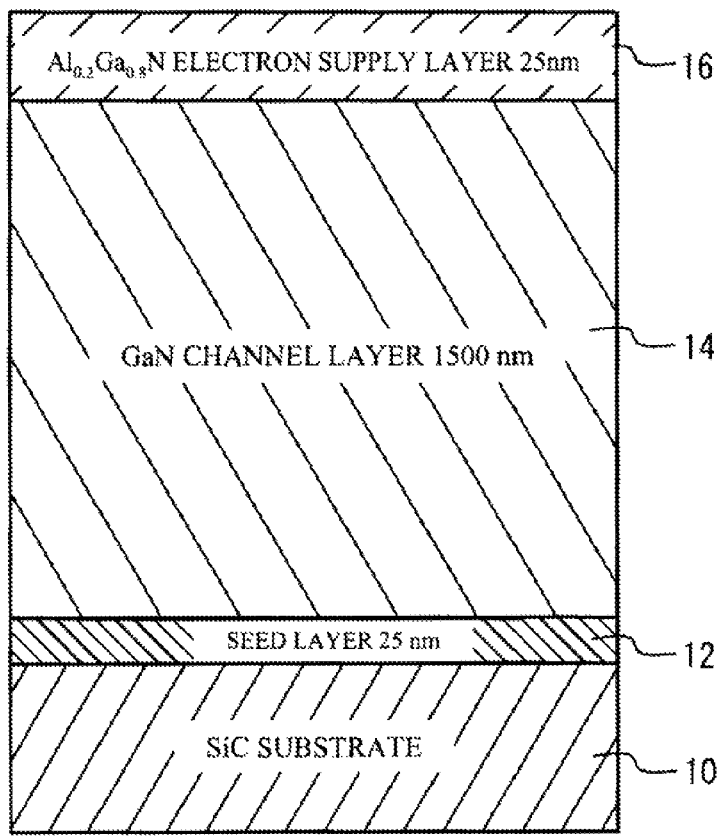
FIG. 2 is a schematic cross-sectional view of an epitaxial layer of a semiconductor device in accordance with a second comparative example.

A semiconductor device of a second comparative example is now described. In the second comparative example, the GaN channel layer 14 is thickened and is grown at a higher temperature in order to reduce the dislocation density of the GaN channel layer 14 and to reduce the emission intensity in the yellow band. FIG. 2 is a schematic cross-sectional view of an epitaxial layer of a semiconductor device in accordance with the second comparative example. Referring to FIG. 2, the seed layer 12 is grown on the SiC substrate 10 by MOCVD under the following condition.

Source gas: TMA, $NH_3$
Growth temperature: 1100° C.
Pressure: 13.3 kPa
Thickness: 25 nm The GaN channel layer 14 is grown on the seed layer 12 under the following condition.

Source gas: TMG, $NH_3$
Growth temperature: 1100° C.
Pressure: 13.3 kPa
V/III ratio: 5000
Growth rate: 0.2 nm/sec
Thickness: 1500 nm The AlGaN electron supply layer 16 is grown on the GaN channel layer 14 under the following condition.

Source gas: TMA, TMG, $NH_3$
Al composition ratio: 20%
Thickness: 25 nm

Figure 3A:
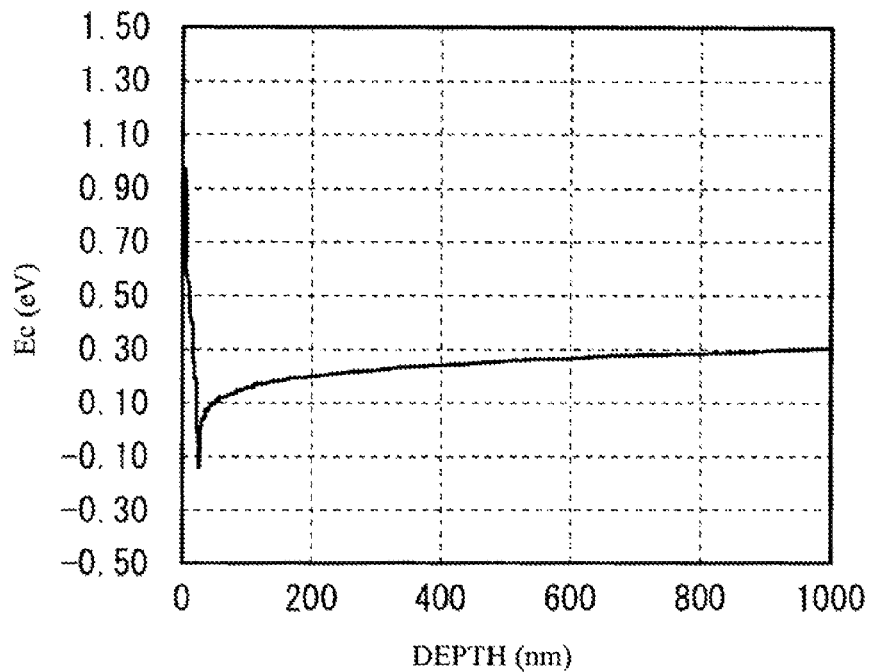
FIG. 3A is a band diagram obtained by simulating a change of Ec associated with the depth from the upper surface of an AlGaN electron supply layer of the first comparative example.
Figure 3B:
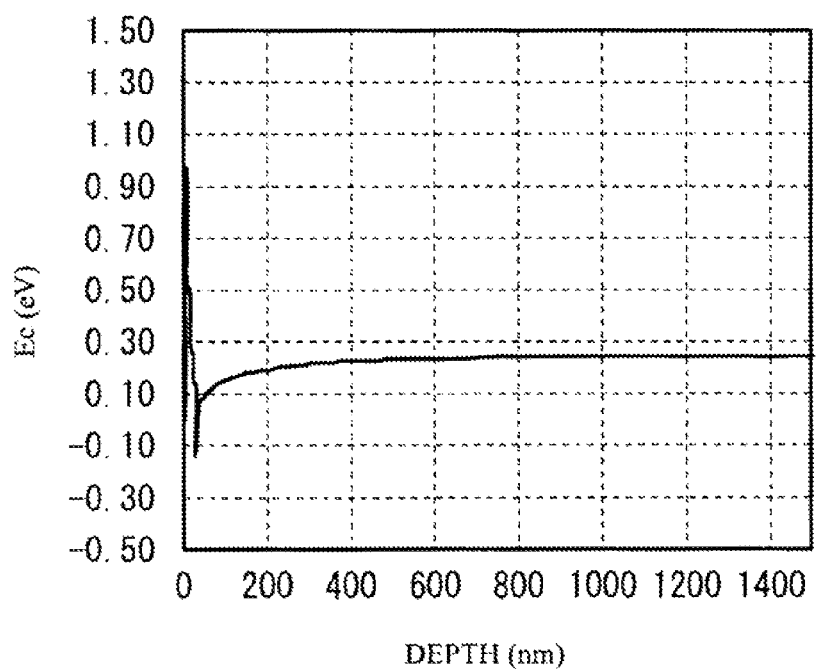
FIG. 3B is a band diagram obtained by simulating a change of Ec associated with the depth from the upper surface of an AlGaN electron supply layer of the second comparative example.

FIG. 3A is a band diagram obtained by simulating a change of Ec (the energy level of the conduction band) associated with the depth from the upper surface of the AlGaN electron supply layer 16 of the first comparative example illustrated in FIG. 1. FIG. 3B is a band diagram obtained by simulating a change of Ec associated with the depth from the upper surface of the AlGaN electron supply layer 16 of the second comparative example illustrated in FIG. 2. In the simulation of the first comparative example, the acceptor concentration (Na) of the GaN channel layer 14 was set to $5.0 \times 10^{14}/cm^3$ and the donor concentration (Nd) thereof was set to $1.0 \times 10^{14}/cm^3$. In the simulation of the second example, the acceptor concentration (Na) of the GaN channel layer 14 was set to $2.0 \times 10^{13}/cm^3$ and the donor concentration (Nd) thereof was set to $1.0 \times 10^{14}/cm^3$. As illustrated in FIGS. 3A and 3B, the second comparative example has low Ec in the GaN channel layer 14, as compared with the first comparative example. This means that the second comparative example achieves reduction of traps but has a degraded pinch-off characteristic.

The inventors simulated an off-state current-voltage characteristic of semiconductor devices configured to provide source, drain and gate electrodes on the AlGaN electron supply layer 16 in the first and second comparative examples. The simulation results show that the drain current for a gate voltage of −3 V is $3.1 \times 10^{-6}$ A/mm in the first comparative example and is $4.5 \times 10^{-4}$ A/mm in the second comparative example. That is, the pinch-off characteristic of the second comparative example is degraded.

The reason why the second comparative example is capable of lowering Ec may be considered as follows. Since there is not a large difference in the band gap between SiC and GaN, the band in the vicinity of the interface between the SiC substrate 10 and the GaN channel layer 14 does not rise even when the GaN channel layer 14 is grown on the SiC substrate 10. In the process of growing the GaN channel layer 14, Si and O included in the source are taken in the GaN channel layer 14. C functions as an acceptor, and O and Si function as donors. As the C concentration is reduced, the acceptor concentration reduces. Thus, a reduced C concentration leads to an increase in the difference between the donor concentration and the acceptor concentration (electron concentration). This increase lowers Ec. Embodiments described below are made in view of the above.

First Embodiment

Figure 4:
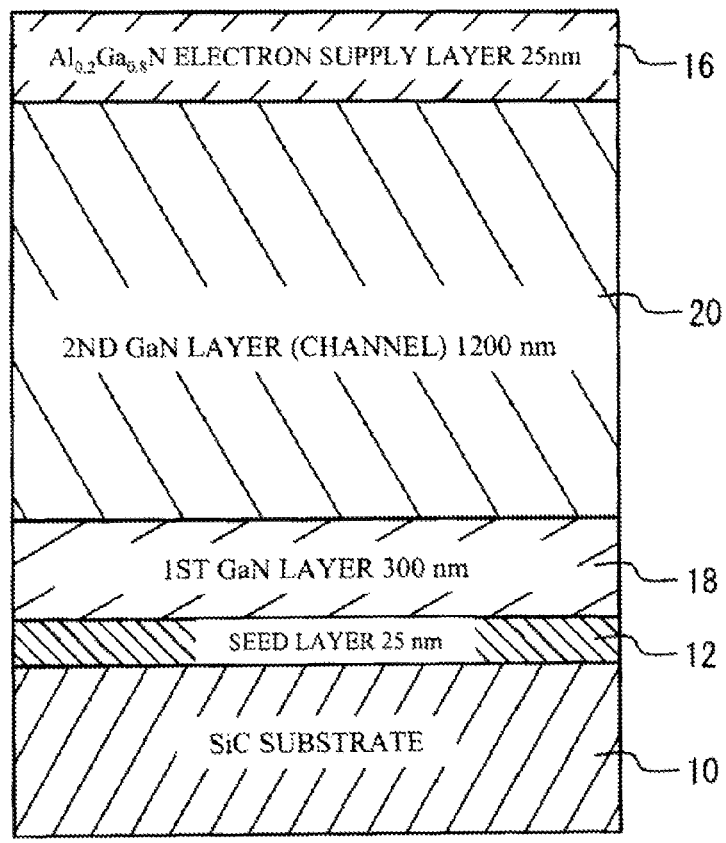
FIG. 4 is a schematic cross-sectional view of a semiconductor device in accordance with a first embodiment.

FIG. 4 is a schematic cross-sectional view of an epitaxial layer of a semiconductor device in accordance with a first embodiment. Referring to FIG. 4, the surface of the SiC substrate 10 after acid cleaning is cleaned in an $H_2$ atmosphere at a temperature higher than the growth temperature. Next, the seed layer 12 made of AlN is grown on the SiC substrate 10 by MOCVD under the following condition.

Source gas: TMA, $NH_3$
Growth temperature: 1100° C.
Pressure: 13.3 kPa
Thickness: 25 nm A first GaN layer 18 is grown on the seed layer 12 under the following condition.

Source gas: TMG, $NH_3$
Growth temperature: 1050° C.
Pressure: 13.3 kPa
V/III ratio: 1000
Growth rate: 0.3 nm/sec
Doping: doped with Zn (zinc) at $1 \times 10^{15}$ $cm^{-3}$
Thickness: 300 nm A second GaN layer 20 (channel layer) is formed on the first GaN layer 18 under the following condition.

Source gas: TMG, $NH_3$
Growth temperature: 1100° C.
Pressure: 13.3 kPa
V/III ratio: 5000
Growth rate: 0.2 nm/sec
Thickness: 1200 nm The AlGaN electron supply layer 16 is grown on the second GaN layer 20 under the following condition.

Source gas: TMA, TMG, $NH_3$
Al composition ratio: 20%
Thickness: 25 nm

The C concentration of the first GaN layer 18 is higher than that of the second GaN layer 20 because the growth temperature and the V/III ratio used in the growth of the first GaN layer 18 are set lower than those used in the growth of the second GaN layer 20 in order to increase the growth rate. In addition, Zn is added to the first GaN layer 18. Thus, the acceptor concentration of the first GaN layer 18 is higher than that of the second GaN layer 20.

Figure 5:
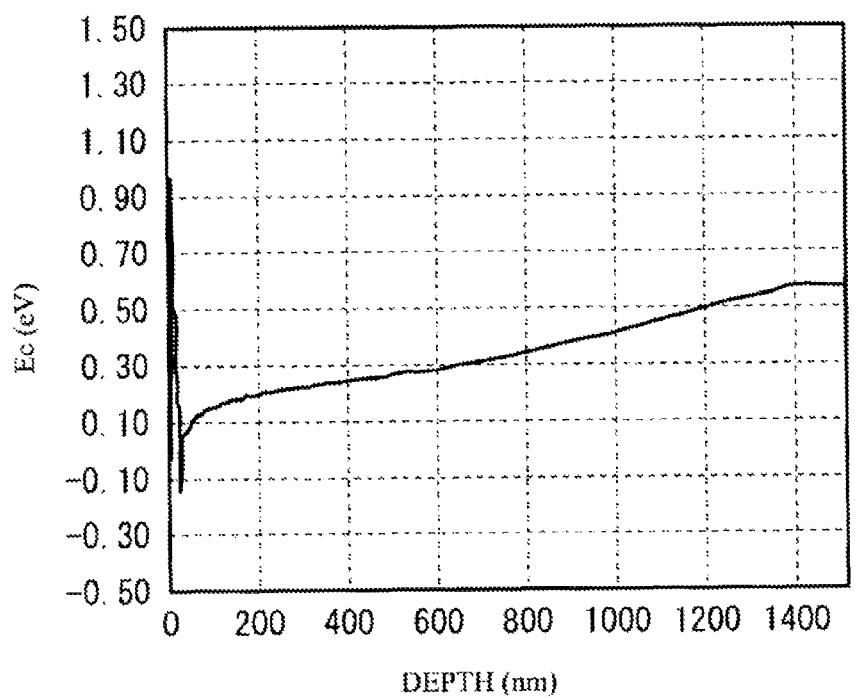
FIG. 5 is a band diagram obtained by simulating a change of Ec associated with the depth from the upper surface of an AlGaN layer of the first embodiment.

FIG. 5 is a band diagram obtained by simulating a change of Ec associated with the depth from the upper surface of the AlGaN electron supply layer 16 in the first embodiment illustrated in FIG. 4. In the simulation of the first embodiment, the acceptor concentration (Na) of the first GaN layer 18 was set to $1.0 \times 10^{15}/cm^3$, and the donor concentration (Nd) thereof was set to $1.0 \times 10^{14}/cm^3$. The acceptor concentration (Na) of the second GaN layer 20 was set to $2.0 \times 10^{13}/cm^3$, and the donor concentration (Nd) thereof was set to $1.0 \times 10^{14}/cm^3$. As illustrated in FIG. 5, Ec of the first GaN layer 18 and Ec of the second GaN layer 20 in the first embodiment are higher than those in the second comparative example. This may be because the first GaN layer 18 is configured to have a high acceptor concentration (Na) and the band at the interface with the SiC substrate 10 is thus raised.

Figure 6:
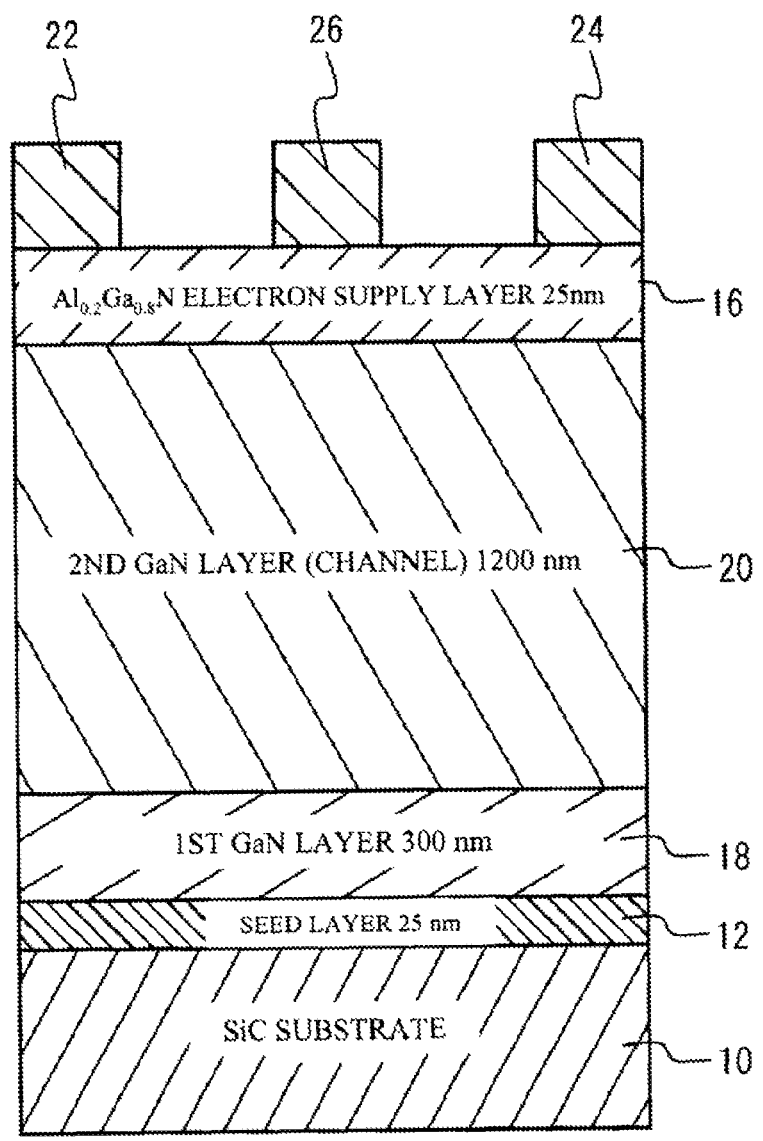
FIG. 6 is a schematic cross-sectional view of another semiconductor device in accordance with the first embodiment.

FIG. 6 is a schematic cross-sectional view of a semiconductor device in accordance with the first embodiment. Referring to FIG. 6, the semiconductor device of the first embodiment has the epitaxial layer illustrated in FIG. 4, and a source electrode 22 and a drain electrode 24 on the AlGaN electron supply layer 16 as ohmic electrodes. The source electrode 22 and the drain electrode 24 may have a two-layer structure formed by stacking Ti (titanium) and Al (aluminum) in this order on the AlGaN electron supply layer 16. A gate electrode 26 is provided on the AlGaN electron supply layer 16 and is interposed between the source electrode 22 and the drain electrode 24. The gate electrode 26 may have a two-layer structure formed by stacking Ni (nickel) and Au (gold) in this order on the AlGaN electron supply layer 16.

Figure 7:
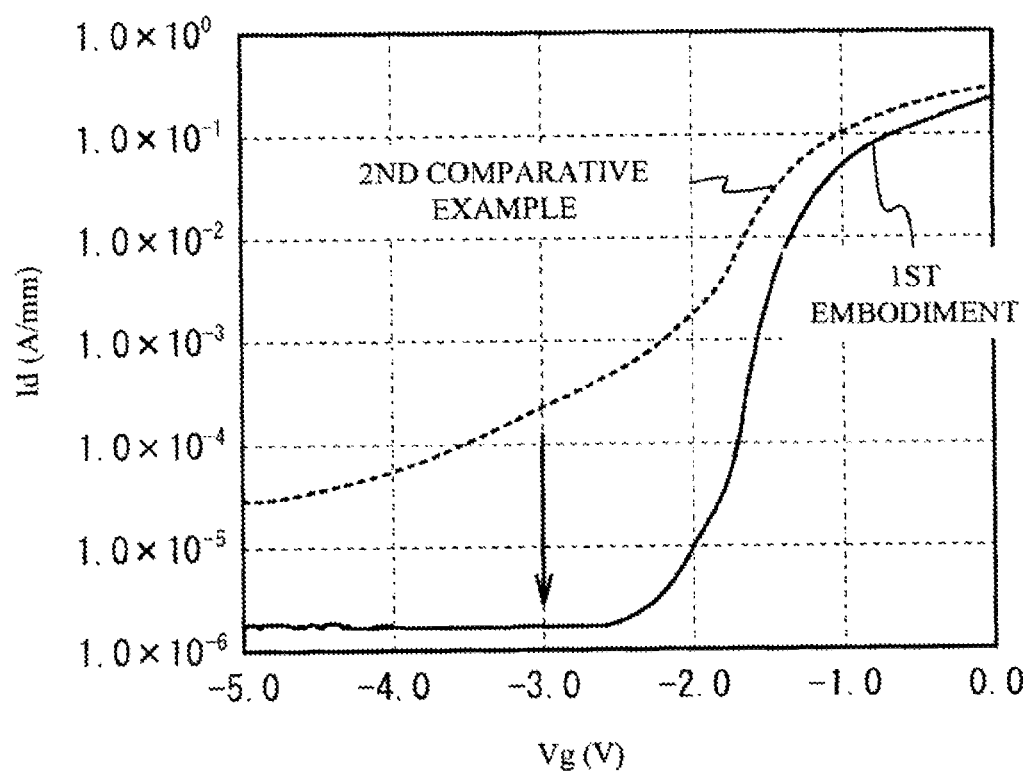
FIG. 7 is a diagram that illustrates the results of a simulation of off-state current-voltage characteristics of the first embodiment and the second comparative example.

FIG. 7 illustrates the results of a simulation the off-state current-voltage characteristic of the semiconductor device configured according to the first embodiment. For the purpose of comparison with the second embodiment, FIG. 7 illustrates the results of a simulation of the off-state current-voltage characteristic of the semiconductor device of the second comparative example. The horizontal axis of FIG. 7 denotes the gate voltage Vg, and the vertical axis denotes the drain current Id. As illustrated in FIG. 7, the drain current Id of the second comparative example is $4.5\times10^{-4}$ A/mm for a gate voltage Vg of $-3$ V. The drain current Id of the first embodiment is $4.3\times10^{-6}$ A/mm for a gate voltage of $-3$ V. The first embodiment is capable of achieving improvement in the pinch-off characteristic, as compared to the second comparative example.

The trap density of the second GaN layer 20 in the first embodiment was measured by DLTS (Deep Level Transient Spectroscopy) after the second embodiment GaN layer 20 was grown. For comparison with the first embodiment, the trap density of the GaN channel layer 14 in the first comparative example was measured by DLTS after the GaN channel layer 14 was grown. The trap density of the first comparative example was $3.0\times10^{12}$ cm$^{-2}$, while the trap density of the first embodiment was $6.0\times10^{11}$ cm$^{-2}$. According to the first embodiment, the trap density was reduced greatly.

As described above, according to the first embodiment, the first GaN layer 18, the second GaN layer 20 and the AlGaN electron supply layer 16 are sequentially stacked on the SiC substrate 10, and the acceptor concentration (Na) of the first GaN layer 18 is set higher than the acceptor concentration (Na) of the second GaN layer 20. Thus, it is possible to raise Ec of the first GaN layer 18 as has been described with reference to FIG. 5 and to improve the pinch-off characteristic as has been described with reference to FIG. 7. Further, since the C concentration of the second GaN layer 20 is restricted to a low level, it is possible to reduce the traps and suppress the transient response of the voltage-current characteristic, which is typically current collapse.

In the first embodiment, Zn is added to the first GaN layer 18 in order to increase the acceptor concentration thereof. Another impurity may be added when a shallow acceptor level is realized. A deep acceptor level forms a trap having a long time constant and causes a long-time current transient response. The shallow acceptor level is preferable equal to or lower than 0.8 eV and is more preferably equal to or lower than 0.5 eV. The impurity may be Mg (magnesium), Zn (zinc), Be (beryllium), C (carbon), Cd (cadmium), As (arsenic), P (phosphorus) or Ca (calcium). The first GaN layer 18 formed by the fabrication method of the first embodiment includes at least C.

The acceptor (Na) of the first GaN layer 18 in the first embodiment is not limited to $1.0\times10^{15}$/cm$^3$. However, if the acceptor concentration (Na) is lower than $1.0\times10^{14}$ cm$^{-3}$, the effect of raising Ec may be weak. In contrast, if the acceptor concentration (Na) is higher than $1.0\times10^{16}$ cm$^{-3}$, the number of traps increases. Thus, the acceptor concentration (Na) is preferably $1.0\times10^{14}$ cm$^{-3}$~$1.0\times10^{16}$ cm$^{-3}$, and is more preferably $3.0\times10^{14}$ cm$^{-3}$~$7.0\times10^{15}$ cm$^{-3}$, and is much more preferably $7.0\times10^{14}$ cm$^{-3}$~$3.0\times10^{15}$ cm$^{-3}$.

The thickness of the first GaN layer 18 is not limited to 300 nm. However, if the thickness of the first GaN layer 18 is less than 100 nm, the effect of raising Ec is weak. In contrast, if the thickness of the first GaN layer 18 is greater than 300 nm, the number of traps increases. Thus, the thickness of the first GaN layer 18 is preferably 100 nm~300 nm, and is more preferably 150 nm~300 nm, and is much more preferably 200 nm~300 nm.

The total thickness of the first GaN layer 18 and the second GaN layer 20 is preferably not less than 1000 nm, and is more preferably not less than 1500 nm. A smaller thickness of the second GaN layer 20 makes it difficult to reduce the transient density and achieve a reduced number of traps because of the influence of the first GaN layer 18 having a high C concentration.

The first embodiment is not limited to HEMT but includes another semiconductor device configured to have the first GaN layer having a high acceptor concentration (Na), the second GaN layer having an acceptor concentration lower than that of the first GaN layer and the electron supply layer, which layers are sequentially stacked on the SiC substrate. The electron supply layer is not limited to AlGaN but may be made of another semiconductor having a band gap greater than that of GaN.

The present invention is not limited to the specifically disclosed embodiments, but various embodiments and variations may be made without departing from the scope of the present invention.

What is claimed is:

1. A semiconductor device comprising:
   a first GaN layer containing carbon provided on a SiC substrate;
   a second GaN layer containing carbon provided on the first GaN layer; and
   an electron supply layer that is provided on the second GaN layer and has a band gap greater than that of GaN,
   the first GaN layer having a carbon concentration higher than that of the second GaN layer,
   wherein an impurity having a shallow acceptor level is added to the first GaN layer, the impurity is at least one of magnesium, zinc, beryllium, cadmium, arsenic, phosphorus, and calcium.

2. The semiconductor device according to claim 1, wherein an acceptor concentration of the first GaN layer is $1.0\times10^{14}$ cm$^{-3}$~$1.0\times10^{16}$ cm$^{-3}$.

3. The semiconductor device according to claim 1, wherein an acceptor concentration of the first GaN layer is $3.0\times10^{14}$ cm$^{-3}$~$7.0\times10^{15}$ cm$^{-3}$.

4. The semiconductor device according to claim 1, wherein an acceptor concentration of the first GaN layer is $7.0\times10^{14}$ cm$^{-3}$~$3.0\times10^{15}$ cm$^{-3}$.

5. The semiconductor device according to claim 1, wherein the first GaN layer has a thickness of 100 nm~300 nm.

6. The semiconductor device according to claim 1, wherein the first GaN layer has a thickness of 150 nm~300 nm.

7. The semiconductor device according to claim 1, wherein the first GaN layer has a thickness of 200 nm~300 nm.

8. The semiconductor device according to claim 6, wherein a total thickness of the first GaN layer and the second GaN layer is at least 1000 nm.

9. The semiconductor device according to claim 7, wherein a total thickness of the first GaN layer and the second GaN layer is at least 1000 nm.

10. The semiconductor device according to claim 6, wherein a total thickness of the first GaN layer and the second GaN layer is at least 1500 nm.

11. The semiconductor device according to claim 7, wherein a total thickness of the first GaN layer and the second GaN layer is at least 1500 nm.

12. The semiconductor device according to claim 1, further comprising an AlN seed layer formed between the SiC substrate and the first GaN layer.

13. The semiconductor device according to claim 1, wherein the first GaN layer and the second GaN layer are formed by Metal-Organic Chemical Vapor Deposition method.

14. The semiconductor device according to claim 1, wherein the second GaN layer acts as a channel layer of High Electron Mobility Transistor.

15. A semiconductor device comprising:
a first GaN layer containing carbon provided on a SiC substrate;
a second GaN layer containing carbon provided on the first GaN layer; and
an electron supply layer that is provided on the second GaN layer and has a band gap greater than that of GaN, the first GaN layer having a carbon concentration higher than that of the second GaN layer,
wherein an acceptor concentration of the first GaN layer is $1.0 \times 10^{14}$ cm$^{-3}$~$1.0 \times 10^{16}$ cm$^{-3}$.

16. A semiconductor device comprising:
a first GaN layer containing carbon provided on a SiC substrate;
a second GaN layer containing carbon provided on the first GaN layer; and
an electron supply layer that is provided on the second GaN layer and has a band gap greater than that of GaN, the first GaN layer having a carbon concentration higher than that of the second GaN layer,
wherein an acceptor concentration of the first GaN layer is $3.0 \times 10^{14}$ cm$^{-3}$~$7.0 \times 10^{15}$ cm$^{-3}$.

17. A semiconductor device comprising:
a first GaN layer containing carbon provided on a SiC substrate;
a second GaN layer containing carbon provided on the first GaN layer; and
an electron supply layer that is provided on the second GaN layer and has a band gap greater than that of GaN, the first GaN layer having a carbon concentration higher than that of the second GaN layer,
wherein an acceptor concentration of the first GaN layer is $7.0 \times 10^{14}$ cm$^{-3}$~$3.0 \times 10^{15}$ cm$^{-3}$.

* * * * *